United States Patent
Srivastava et al.

(10) Patent No.: US 10,277,244 B1
(45) Date of Patent: Apr. 30, 2019

(54) SUCCESSIVE APPROXIMATION REGISTER (SAR) ANALOG-TO-DIGITAL CONVERTER (ADC) WITH PASSIVE GAIN SCALING

(71) Applicant: QUALCOMM Incorporated, San Diego, CA (US)

(72) Inventors: Ankit Srivastava, San Diego, CA (US); Sameer Wadhwa, San Diego, CA (US); Shunxi Wang, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/046,053

(22) Filed: Jul. 26, 2018

(51) Int. Cl.
*H03M 1/38* (2006.01)
*H03M 1/46* (2006.01)
*H03G 3/30* (2006.01)

(52) U.S. Cl.
CPC .......... *H03M 1/466* (2013.01); *H03G 3/3089* (2013.01); *H03M 1/462* (2013.01)

(58) Field of Classification Search
CPC ...... H03M 1/00; H03M 1/0646; H03M 1/785; H03M 1/12; H03M 1/466; H03M 1/462; H03G 3/3089
USPC ........................................ 341/161, 155, 156
See application file for complete search history.

(56) References Cited

U.S. PATENT DOCUMENTS

| | | | | |
|---|---|---|---|---|
| RE37,751 E * | 6/2002 | Sutardja | ........... | G11B 20/10009 327/100 |
| 7,015,841 B2 * | 3/2006 | Yoshida | .............. | H03M 1/1245 341/120 |
| 8,754,798 B2 * | 6/2014 | Lin | .......... | H03M 1/38 341/118 |
| 9,041,569 B2 * | 5/2015 | Zhou | .................. | H03M 1/0617 341/118 |
| 9,071,265 B1 * | 6/2015 | Dey | ..................... | H03M 1/0695 |
| 9,287,891 B1 * | 3/2016 | Lee | ....................... | H03M 1/0641 |
| 2009/0073018 A1 * | 3/2009 | Mitikiri | ................. | H03M 1/145 341/156 |
| 2012/0306676 A1 * | 12/2012 | Balasubramaniam | ....................... | H03M 1/0678 341/144 |
| 2013/0044015 A1 * | 2/2013 | Reinhold | ............ | H03M 1/1061 341/110 |
| 2013/0162454 A1 * | 6/2013 | Lin | ......................... | H03M 1/38 341/120 |
| 2014/0070968 A1 * | 3/2014 | Janakiraman | ....... | H03M 1/0697 341/110 |
| 2016/0308665 A1 * | 10/2016 | Luo | ....................... | H04L 7/0087 |

* cited by examiner

*Primary Examiner* — Jean B Jeanglaude
(74) *Attorney, Agent, or Firm* — Patterson & Sheridan, L.L.P.

(57) ABSTRACT

Certain aspects of the present disclosure provide a successive approximation register (SAR) analog-to-digital converter (ADC) implemented with a passive gain scaling architecture. Certain aspects provide a circuit for analog-to-digital conversion. The circuit generally includes a plurality of capacitive elements, a plurality of switches coupled to the plurality of capacitive elements, and SAR logic having an output coupled to control inputs of the plurality of switches. The circuit also includes a comparator having an output coupled to an input of the SAR logic, a sampling circuit coupled to an input node of the circuit, and a first capacitive element coupled in series between the sampling circuit and the plurality of capacitive elements.

20 Claims, 6 Drawing Sheets

SUCCESSIVE APPROXIMATION REGISTER (SAR) ANALOG-TO-DIGITAL CONVERTER (ADC) WITH PASSIVE GAIN SCALING

TECHNICAL FIELD

Certain aspects of the present disclosure generally relate to electronic circuits and, more particularly, to a successive approximation register (SAR) analog-to-digital converter (ADC).

BACKGROUND

Many electronic devices include one or more analog-to-digital converters (ADCs), for converting analog signals to digital signals for additional processing in the digital domain. Several types of ADCs are available, each with varying advantages and disadvantages. For example, a successive approximation register (SAR) ADC may provide an area and power-efficient architecture for low to medium accuracy analog-to-digital conversion applications. A SAR ADC may use a comparator and logic to approximate a digital value corresponding to an analog input. Another type of ADC is referred to as a flash ADC, which may provide a faster conversion speed at the cost of an exponential increase in power and area consumption.

SUMMARY

Certain aspects of the present disclosure generally relate to a successive approximation register (SAR) analog-to-digital converter (ADC) implemented with a passive gain scaling architecture.

Certain aspects provide a circuit for analog-to-digital conversion. The circuit generally includes a plurality of capacitive elements, a plurality of switches coupled to the plurality of capacitive elements, and SAR logic having an output coupled to a control input of the plurality of switches. The circuit also includes a comparator having an output coupled to an input of the SAR logic, a sampling circuit coupled to an input node of the circuit, and a first capacitive element coupled in series between the sampling circuit and the plurality of capacitive elements.

Certain aspects provide a circuit for analog-to-digital conversion. The circuit generally includes SAR logic; a comparator having an output coupled to an input of the SAR logic; a capacitive voltage divider, a tap of the capacitive voltage divider being coupled to an input of the comparator; and a sampling circuit coupled to an input node of the circuit.

Certain aspects provide a method for analog-to-digital conversion. The method generally includes generating a scaled-down voltage of an analog input signal via a capacitive voltage divider, the scaled-down voltage being generated across a plurality of capacitive elements of a SAR ADC; and determining, via a logic controller of the SAR ADC, a digital output signal corresponding to the scaled-down voltage.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure generally relate to a successive approximation register (SAR) analog-to-digital converter (ADC) implemented with a passive gain scaling architecture.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Touch Screen System

Figure 1:
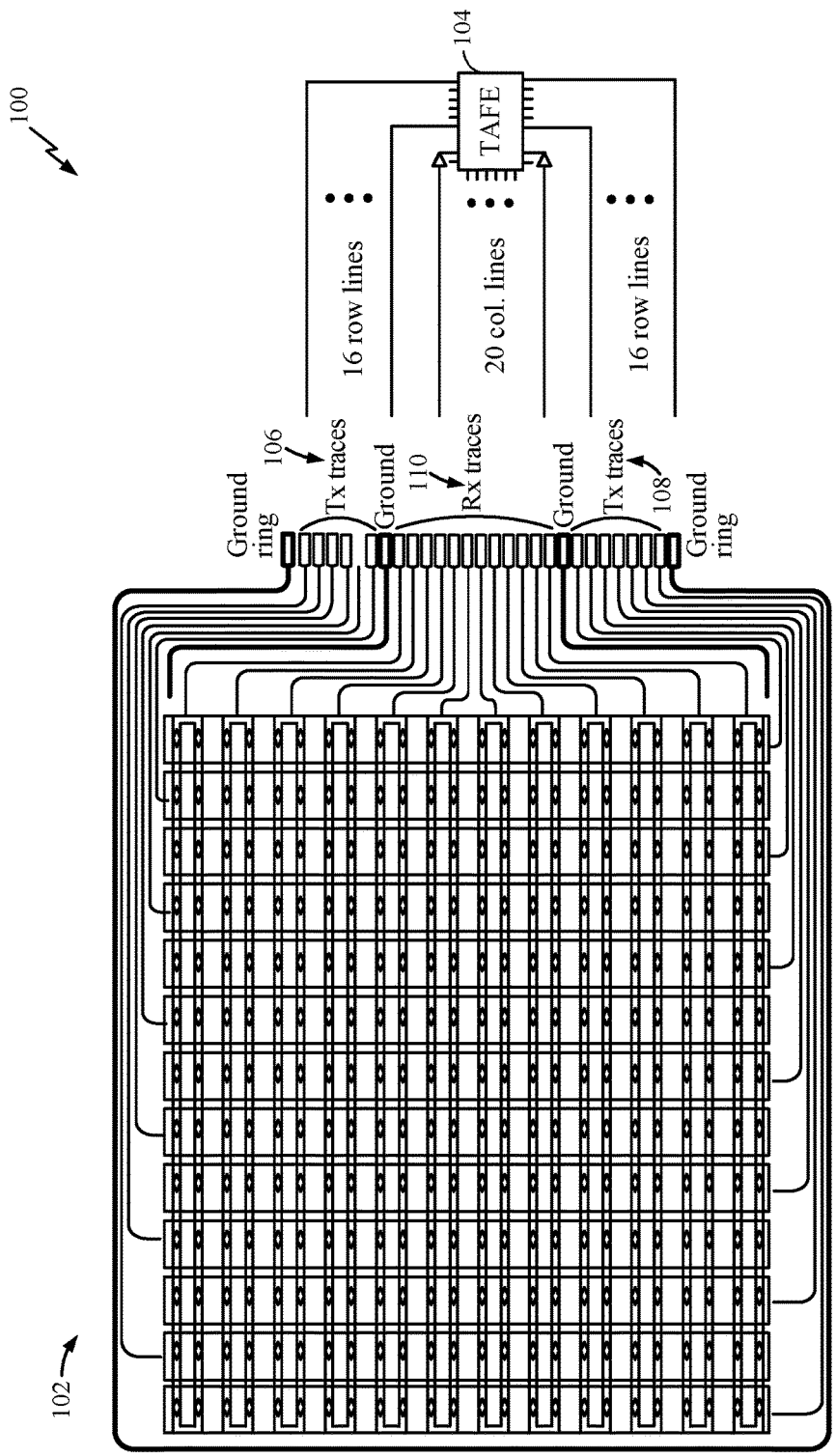
FIG. 1 is a block diagram illustrating a touch screen system, in which aspects of the present disclosure may be implemented.

FIG. 1 is a block diagram illustrating a touch screen system 100, in which aspects of the present disclosure may be implemented. The touch screen system 100 includes touch electrodes 102 and a touch screen controller 104.

The touch screen controller 104 may apply signals via transmitter (TX) traces 106, 108 to the touch electrodes 102, and receive signals from the touch electrodes 102 via the receiver (RX) traces 110 to determine whether the touch electrodes (and which touch electrodes) are being touched. For example, the touch screen controller 104 may include an analog front-end (AFE) circuit for processing the received signals, and an analog-to-digital converter (ADC) for converting the received signals to digital signals for digital processing. In certain aspects, the ADC may be implemented as a successive approximation register (SAR) ADC due to the low power consumption of SAR ADCs.

The AFE circuit of the touch screen controller 104 may be operated with a relatively high supply voltage (e.g., a 1.8 V supply voltage) such that the AFE circuit is able to handle jammer signals that may be received when the touch electrodes 102 are touched. However, the SAR ADC may be operated from a lower voltage (e.g., 1.1 V) to reduce power consumption of the SAR ADC. Thus, the operating voltage range of the AFE circuit may be higher than the operating voltage range of the SAR ADC. Certain aspects of the present disclosure are generally directed to SAR ADC circuitry implemented with a passive gain scaling architecture for reducing a voltage of an analog input signal received from the AFE circuit to a lower voltage to fit in to the SAR ADC dynamic range. The passive gain scaling technology described herein consumes little to no extra power over conventional architecture designs with little to no noise penalty.

An Example SAR ADC with Passive Gain Scaling

Figure 2:
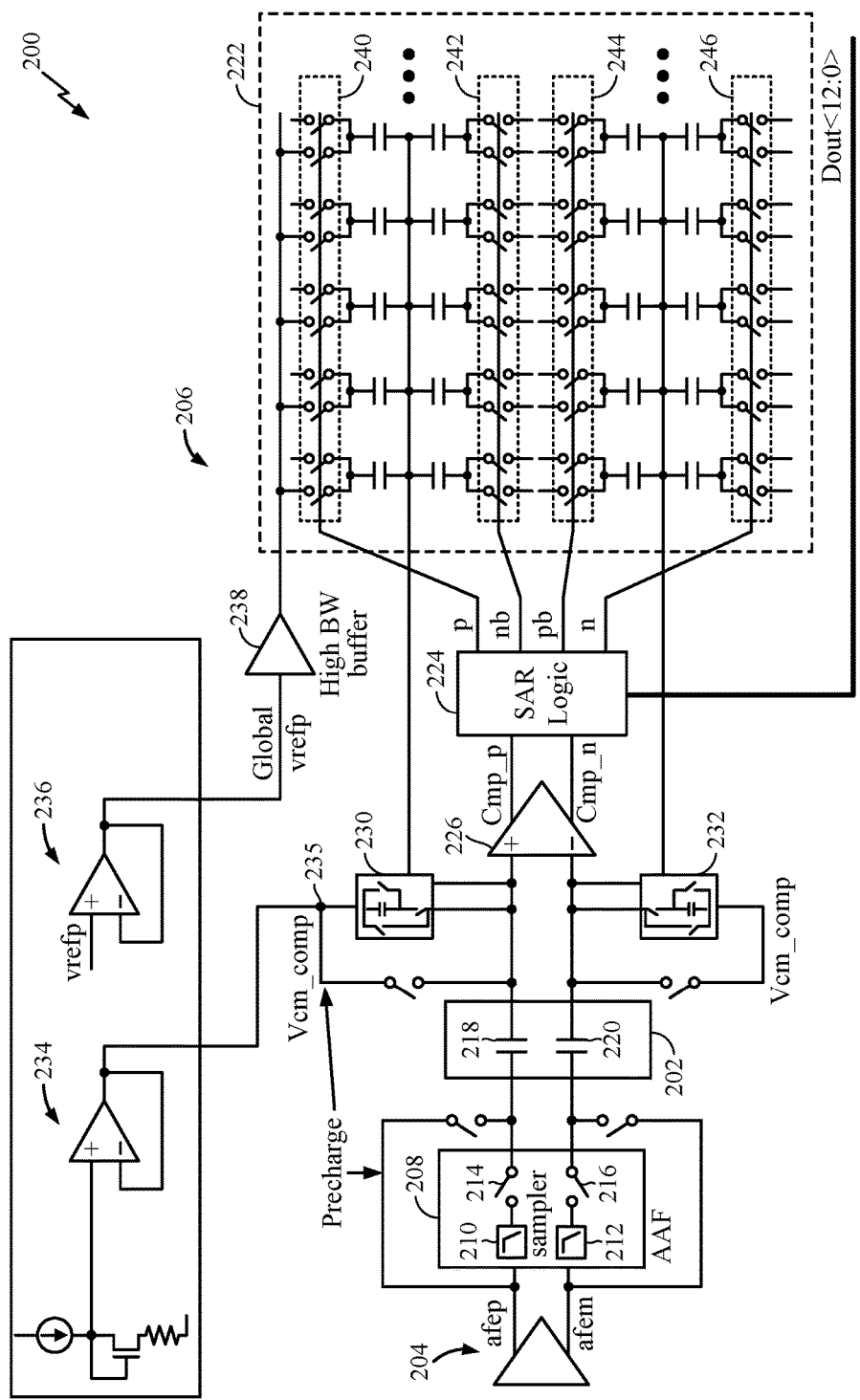
FIG. 2 illustrates a signal processing circuit having a passive gain scaling circuit, in accordance with certain aspects of the present disclosure.

FIG. 2 illustrates a signal processing circuit 200 having a passive gain scaling circuit 202 implemented between an AFE circuit 204 and a SAR ADC 206, in accordance with certain aspects of the present disclosure. The AFE circuit 204 may be coupled to a sampling circuit 208. The sampling circuit 208 may include anti-aliasing filters (AAFs) 210, 212, each coupled in series with a switch 214, 216 which may be closed during a sampling phase to sample a differential input pair signal (with signal components labeled "afep" and "afem") provided by the AFE circuit 204, as described in more detail herein.

As illustrated, the passive gain scaling circuit 202 includes capacitive elements 218, 220. A capacitive element as described herein may be implemented, for example, by a dedicated capacitor or the capacitance of a transistor. The capacitive elements 218, 220 are coupled in a signal path between the sampling circuit 208 and the capacitive elements 222 of the SAR ADC 206. The SAR ADC 206 also includes SAR logic 224 (e.g., a finite state machine (FSM)). The SAR logic 224 controls switches 240, 242, 244, 246 coupled to the capacitive elements 222, based on an output of the comparator 226, to approximate a digital value corresponding to the analog input signal. Each of the switches 240, 242, 244, and 246 couple a respective one of the capacitive elements 222 to Vrefp or Verfn. The SAR logic 224 generates a digital output signal (Dout), as illustrated.

The signal processing circuit 200 also includes biasing circuits 230, 232 to compensate for leakage current that may otherwise vary the common-mode (CM) voltage of the comparator 226. As illustrated, the biasing circuits 230, 232 are coupled to a voltage source 234 for applying, at the CM node 235, the CM voltage (Vcm_comp) of the comparator 226 to the biasing circuits 230, 232, as illustrated. The biasing circuits 230 and 232 are switched-capacitor circuits, effectively implementing a resistive element between the CM node 235 and the inputs of the comparator 226 to set the input CM voltage of the comparators 226. In certain aspects, each of the biasing circuits 230 and 232 may be implemented with a resistive element instead of a switched-capacitor circuit. In certain aspects, the signal processing circuit 200 may also include a voltage source 236 (e.g., a buffer) for providing a reference voltage (labeled "Global Vrefp") for the SAR ADC 206 through a high-bandwidth buffer 238.

Figure 3:
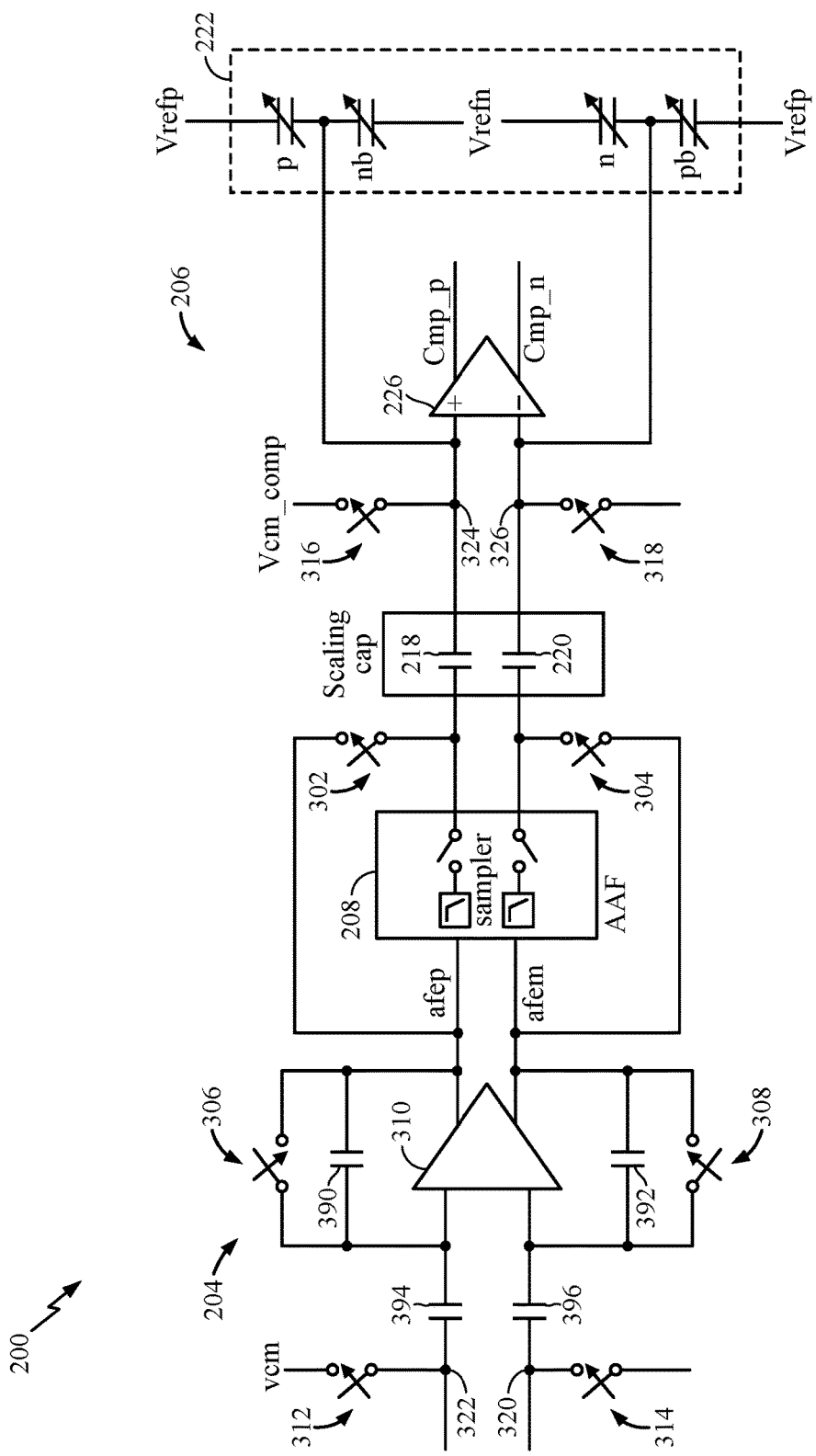
FIG. 3 illustrates the signal processing circuit of FIG. 2 during a precharge phase, in accordance with certain aspects of the present disclosure.

FIG. 3 illustrates the signal processing circuit 200 during a precharge phase, in accordance with certain aspects of the present disclosure. The precharge phase is intended to preset the CM voltages of the AFE circuit 204 and the comparator 226 before the AFE circuit 204 and the SAR ADC 206 are enabled for data capture during the sampling and conversion phases. By presetting the CM voltages of the AFE circuit 204 and the comparator 226, parasitic capacitances of the signal processing circuit 200 are precharged, increasing the analog-to-digital conversion speed. For example, without presetting the input CM voltage of the comparators 226 during the precharge phase, the input CM voltage of the comparator 226 may be set to zero volts at the beginning of the sampling phase described with respect to FIG. 4. The biasing circuits 230, 232 would then charge the input CM voltage of the comparators 226, which could take a few milliseconds to perform, limiting the startup time of the conversion phase described with respect to FIG. 5.

In certain aspects, capacitive elements 390, 392 are coupled between respective differential input nodes and differential output nodes of the amplifier 310. Moreover, capacitive elements 394, 396 are coupled to the inputs of the amplifier 310, as illustrated. During the precharge phase, precharge switches 302, 304, 306, 308 are closed, shorting the amplifier 310 of the AFE circuit 204 and the sampling circuit 208. Moreover, switches 312, 314 may also be closed, coupling the differential input nodes 320, 322 of the AFE circuit 204 to a voltage source providing the CM voltage (Vcm) of the AFE circuit 204. Moreover, switches 316 and 318 may be closed, coupling the differential input nodes 324, 326 of the comparator 226 to Vcm_comp. By closing switches 316, 318, the parasitic capacitances of the comparator 226, as well as the capacitive elements 222 of the SAR ADC, are charged, allowing for a faster analog-to-digital conversion process. Moreover, switches 316, 318 may be closed during the precharge phase to set the CM voltage corresponding to the capacitive elements 218, 220.

Figure 4:
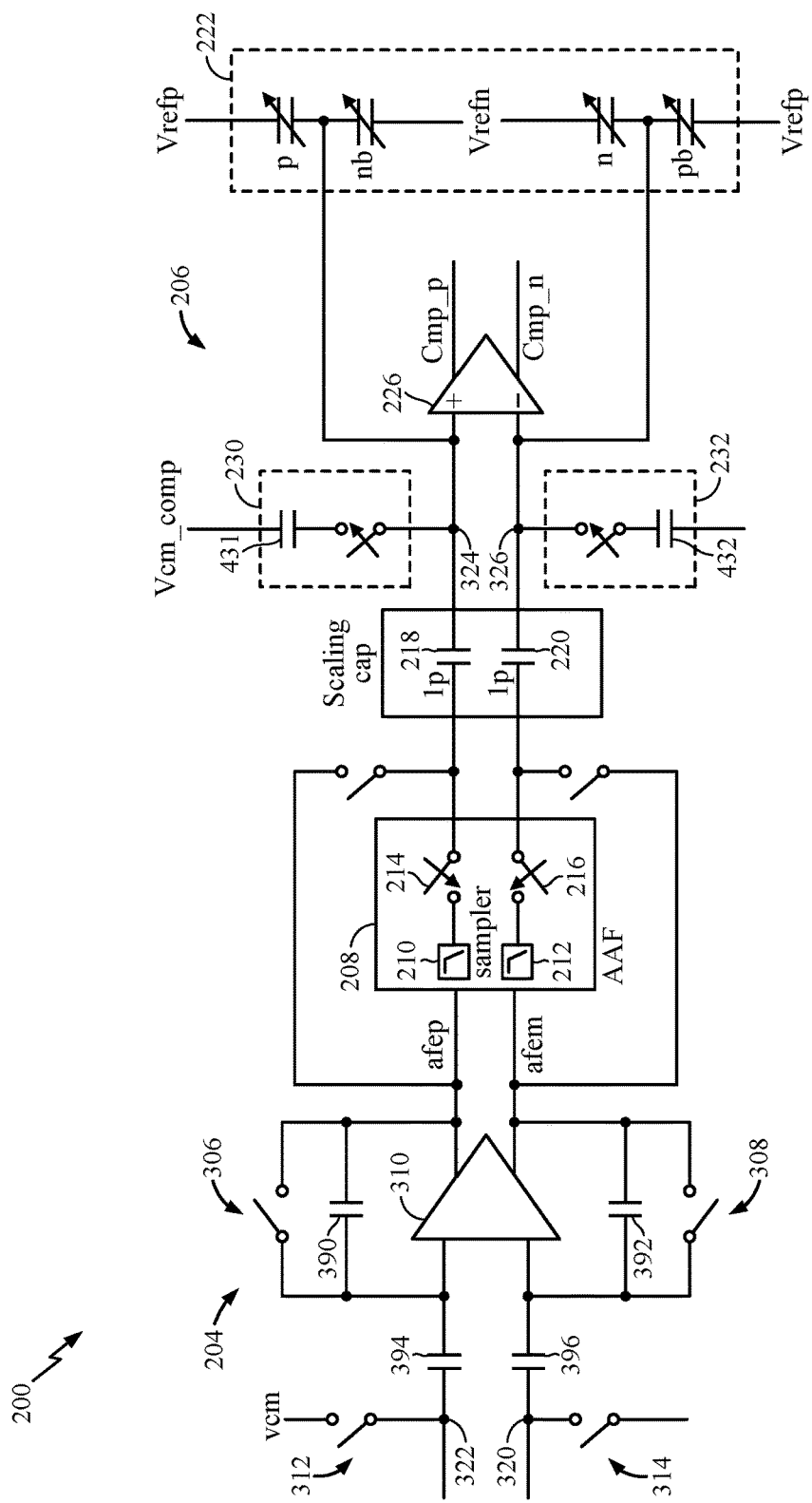
FIG. 4 illustrates the signal processing circuit of FIG. 2 during a sampling phase, in accordance with certain aspects of the present disclosure.

FIG. 4 illustrates the signal processing circuit 200 during a sampling phase, in accordance with certain aspects of the present disclosure. During the sampling phase, the switches 214 and 216 are closed to sample the output signal generated by the AFE circuit 204 on the capacitive elements 218, 220 and the capacitive elements 222, effectively scaling the analog input voltage to within the dynamic range of the SAR ADC. In other words, the capacitive elements 218, 220 (e.g., 1 pF capacitive elements) and the capacitive elements 222 of the SAR ADC form a capacitive voltage divider. The capacitive voltage divider generates a scaled-down voltage at the differential input nodes 324, 326 based on the analog input signal, allowing the SAR ADC 206 to be operated with a lower supply voltage as compared to the supply voltage of the AFE circuit 204. In other words, the scaled-down voltage is generated at taps of the capacitive voltage divider, the taps of the capacitive voltage divider being coupled to the differential input nodes 324, 326 of the comparator 226.

Capacitive elements 431, 432 of the biasing circuit 230, 232 may be coupled to the differential input nodes 324, 326 to compensate for leakage current at the input of the comparator 226. By coupling the differential input nodes 324, 326 to a source providing Vcm_comp, current flows to the differential input nodes 324, 326 to prevent, or at least reduce, variations of the CM voltage at the input of the comparator 226 during the sampling phase. During the sampling phase, the switches 312, 314, 306, 308 are open, as illustrated.

Figure 5:
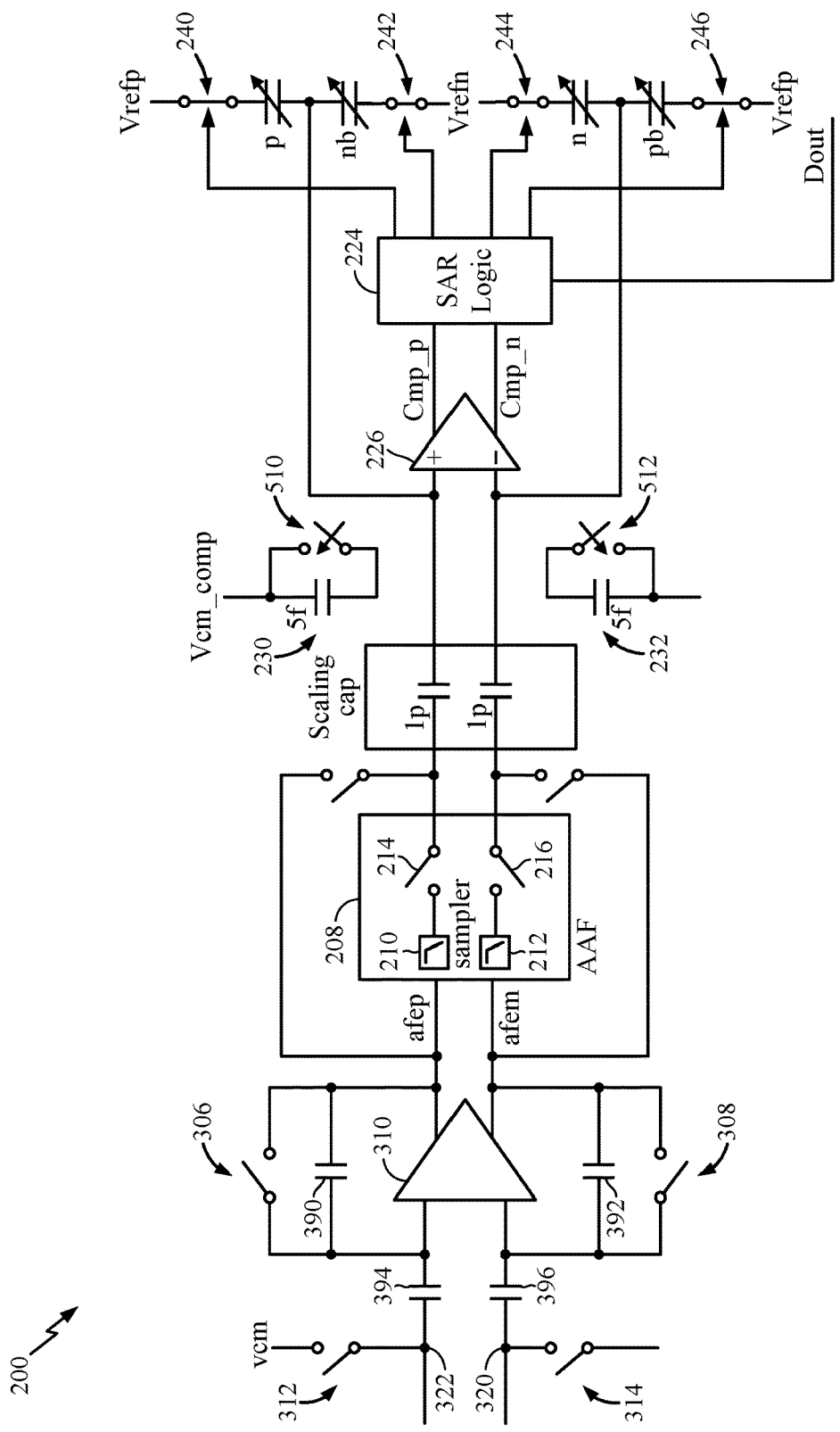
FIG. 5 illustrates the signal processing circuit of FIG. 2 during a conversion phase, in accordance with certain aspects of the present disclosure.

FIG. 5 illustrates the signal processing circuit 200 during a conversion phase (e.g., an analog-to-digital conversion phase), in accordance with certain aspects of the present disclosure. During the conversion phase, the SAR logic 224 controls switches 240, 242, 244, 246 to determine the digital value Dout, as previously described. Moreover, during the conversion phase, the capacitive elements 431, 432 of the biasing circuits 230, 232 are discharged by closing parallel switches 510, 512, before subsequent precharge, sampling, and conversion phases begin. During the conversion phase, the switches 312, 314, 306, 308, 214, 216 are open, as illustrated.

Figure 6:
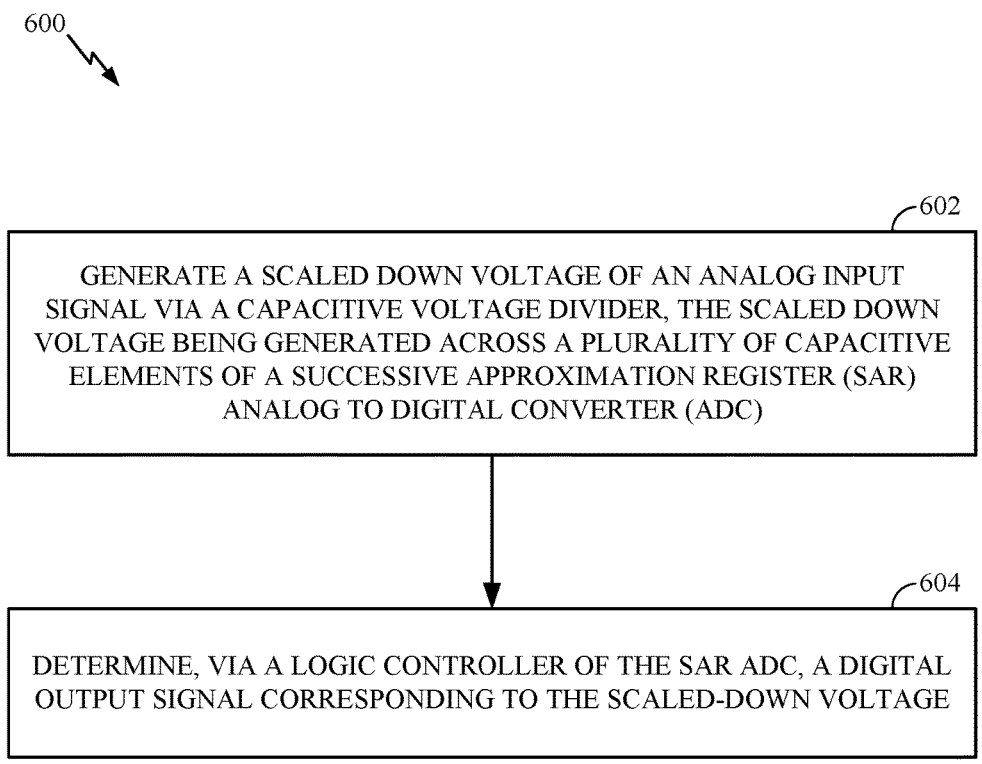
FIG. 6 is a flow diagram of example operations for analog-to-digital conversion, in accordance with certain aspects of the present disclosure.

FIG. 6 is a flow diagram of example operations 600 for analog-to-digital conversion, in accordance with certain aspects of the present disclosure. The operations 600 may be performed by a circuit, such as the signal processing circuit 200.

The operations 600 may begin, at block 602, by generating a scaled-down voltage of an analog input signal via a capacitive voltage divider. The scaled-down voltage may be generated across a plurality of capacitive elements (e.g., the capacitive elements 222) of a SAR ADC (e.g., SAR ADC 206). At block 604, a digital output signal corresponding to the scaled-down voltage may be determined via a logic controller of the SAR ADC.

In certain aspects, the operations 600 may also include supplying a biasing current (e.g., via biasing circuit 230 or 232) to a node of the capacitive voltage divider from a supply node providing a CM voltage of the SAR ADC. In certain aspects, the CM voltage of the SAR ADC may be set during a precharge phase, where the biasing current is supplied during a sampling phase to maintain the CM voltage.

The various operations of methods described above may be performed by any suitable means capable of performing the corresponding functions. The means may include various hardware and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. In addition, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for analog-to-digital conversion, comprising:
a plurality of capacitive elements;
a plurality of switches coupled to the plurality of capacitive elements;
successive approximation register (SAR) logic having an output coupled to control inputs of the plurality of switches;
a comparator having an output coupled to an input of the SAR logic and an input coupled to the plurality of capacitive elements;
a sampling circuit coupled to an input node of the circuit; and
a first capacitive element coupled in series between the sampling circuit and the input of the comparator.

2. The circuit of claim 1, further comprising:
an analog front-end (AFE) circuit having an input coupled to the input node and an output coupled to the sampling circuit.

3. The circuit of claim 2, wherein the AFE circuit comprises:
an amplifier;
a second capacitive element coupled between an input of the amplifier and an output of the amplifier; and
a third capacitive element having a first terminal coupled to the input of the amplifier.

4. The circuit of claim 3, wherein the AFE circuit further comprises:
a first switch coupled between a common-mode (CM) node and a second terminal of the third capacitive element; and
a second switch coupled between the input of the amplifier and the output of the amplifier.

5. The circuit of claim 4, wherein the first switch and the second switch are configured to be closed during a precharge phase of the circuit.

6. The circuit of claim 1, wherein the plurality of capacitive elements and the first capacitive element form a capacitive voltage divider, a tap of the capacitive voltage divider being coupled to the input of the comparator.

7. The circuit of claim 1, further comprising:
a switch coupled between an input of the comparator and a common-mode (CM) node.

8. The circuit of claim 7, wherein the switch is configured to be closed during a precharge phase of the circuit.

9. The circuit of claim 7, wherein the CM node is coupled to a voltage source, the voltage source configured to apply a CM voltage associated with the comparator to the CM node.

10. The circuit of claim 1, further comprising:
a switch coupled in parallel with the sampling circuit.

11. The circuit of claim 1, further comprising:
a biasing circuit coupled between an input of the comparator and a common-mode (CM) node.

12. The circuit of claim 11, wherein the biasing circuit comprises:
a second capacitive element selectively coupled between the CM node and the input of the comparator via a first switch.

13. The circuit of claim 12, wherein the first switch is configured to be closed during a sampling phase of the circuit.

14. The circuit of claim 12, further comprising:
a second switch coupled in parallel with the second capacitive element, wherein the second switch is configured to be closed during an analog-to-digital conversion phase of the circuit.

15. The circuit of claim 11, wherein the CM node is coupled to a voltage source, the voltage source configured to apply a CM voltage associated with the comparator to the CM node.

16. The circuit of claim 1, wherein each of the plurality of switches is coupled to a respective one of the plurality of capacitive elements.

17. A circuit for analog-to-digital conversion, comprising:
successive approximation register (SAR) logic;
a comparator having an output coupled to an input of the SAR logic;
a capacitive voltage divider, a tap of the capacitive voltage divider being coupled to an input of the comparator; and
a sampling circuit coupled to an input node of the circuit.

18. The circuit of claim 17, further comprising:
a biasing circuit coupled between the input of the comparator and a common-mode (CM) node.

19. A method for analog-to-digital conversion, comprising:
generating a scaled-down voltage of an analog input signal via a capacitive voltage divider, the scaled-down voltage being generated across a plurality of capacitive elements of a successive approximation register (SAR) analog-to-digital converter (ADC); and
determining, via a logic controller of the SAR ADC, a digital output signal corresponding to the scaled-down voltage.

20. The method of claim 19, further comprising:
supplying a biasing current to a node of the capacitive voltage divider from a supply node providing a common-mode (CM) voltage of the SAR ADC.

* * * * *